(12) United States Patent
Wu et al.

(10) Patent No.: US 11,502,180 B2
(45) Date of Patent: Nov. 15, 2022

(54) SEMICONDUCTOR DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Chia-Wei Wu, Taichung (TW); Ting-Pang Chung, Taichung (TW); Tien-Chen Chan, Tainan (TW); Shu-Yen Chan, Changhua County (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/792,308

(22) Filed: Feb. 17, 2020

(65) Prior Publication Data
US 2020/0185505 A1 Jun. 11, 2020

Related U.S. Application Data

(62) Division of application No. 15/873,904, filed on Jan. 18, 2018, now Pat. No. 10,608,093.

(30) Foreign Application Priority Data

Jan. 23, 2017 (CN) .......................... 201710058332.9

(51) Int. Cl.
*H01L 29/423* (2006.01)
*H01L 21/02* (2006.01)
(Continued)

(52) U.S. Cl.
CPC .... *H01L 29/4236* (2013.01); *H01L 21/02233* (2013.01); *H01L 21/02244* (2013.01);
(Continued)

(58) Field of Classification Search
CPC ......... H01L 27/10876; H01L 27/10823; H01L 29/4236; H01L 27/10891; H01L 27/10885;
(Continued)

(56) References Cited

U.S. PATENT DOCUMENTS 5,637,528 A 6/1997 Higashitani
5,939,353 A 8/1999 Bhattacharyya
(Continued)

FOREIGN PATENT DOCUMENTS

CN 1507016 A 6/2004
CN 101944531 A 1/2011
(Continued)

OTHER PUBLICATIONS

Oleg Semenov, "Contribution of gate induced drain leakage to overall leakage and yield loss in digital submicron VLSI circuits", Publish: Integrated Reliability Workshop Final Report, 2001. 2001 IEEE International pp. 49-53.
(Continued)

*Primary Examiner* — Marcos D. Pizarro
*Assistant Examiner* — Antonio B Crite
(74) *Attorney, Agent, or Firm* — Winston Hsu

(57) ABSTRACT

A semiconductor device includes a substrate having at least a trench formed therein. A conductive material fills a lower portion of the trench. A barrier layer is between the conductive material and the substrate. An insulating layer is in the trench and completely covers the conductive material
(Continued)

FIG. 6 and the barrier layer, wherein a portion of the insulating layer covering the barrier layer has a bird's peak profile.

6 Claims, 4 Drawing Sheets

(51) Int. Cl.
*H01L 27/108* (2006.01)
*H01L 27/12* (2006.01)
*H01L 29/06* (2006.01)
*H01L 29/08* (2006.01)
*H01L 29/49* (2006.01)
*H01L 27/11568* (2017.01)
*H01L 27/11578* (2017.01)

(52) U.S. Cl.
CPC ...... *H01L 21/02255* (2013.01); *H01L 27/108* (2013.01); *H01L 27/10823* (2013.01); *H01L 27/10876* (2013.01); *H01L 27/10885* (2013.01); *H01L 27/10891* (2013.01); *H01L 27/12* (2013.01); *H01L 29/0649* (2013.01); *H01L 29/0847* (2013.01); *H01L 29/4238* (2013.01); *H01L 29/4908* (2013.01)

(58) Field of Classification Search
CPC ............... H01L 27/108; H01L 29/7825; H01L 29/7813; H01L 29/66613–29/66628
See application file for complete search history.

(56) References Cited

U.S. PATENT DOCUMENTS

| | | | |
|---|---|---|---|
| 6,667,197 | B1 | 12/2003 | Gluschenkov |
| 6,800,927 | B2 | 10/2004 | Noble |
| 9,437,697 | B2 | 9/2016 | Cho |
| 9,449,830 | B2 | 9/2016 | Kang |
| 2005/0148173 | A1 | 7/2005 | Shone |
| 2007/0218609 | A1 | 9/2007 | Tatsumi |
| 2008/0191288 | A1 | 8/2008 | Kwon |
| 2010/0240184 | A1 | 9/2010 | Jung |
| 2011/0001186 | A1 | 1/2011 | Seo |
| 2013/0043519 | A1* | 2/2013 | Moon ............... H01L 29/42368 257/296 |
| 2013/0341710 | A1* | 12/2013 | Choi ................. H01L 27/10876 257/330 |
| 2014/0367801 | A1* | 12/2014 | Liu .................... H01L 21/02068 257/407 |
| 2016/0351711 | A1* | 12/2016 | Bae ..................... H01L 29/4236 |
| 2017/0125532 | A1* | 5/2017 | Jang ..................... H01L 29/517 |
| 2017/0263723 | A1* | 9/2017 | Lee .................. H01L 29/66666 |
| 2017/0365608 | A1* | 12/2017 | Lee ....................... H01L 23/528 |

FOREIGN PATENT DOCUMENTS

| | | |
|---|---|---|
| CN | 105374820 A | 3/2016 |
| KR | 10-0195355 B1 | 6/1999 |
| KR | 10-0847308 B1 | 7/2008 |
| KR | 10-2010-0106112 A | 10/2010 |

OTHER PUBLICATIONS

Songlin Xu, "Study of Tungsten oxidation in O2/H2/N2 downstream plasma", Publish: Journal of Vacuum Science & Technology A: Vacuum, Surfaces, and Films, vol. 26, Issue 3, May 2008 pp. 360-364.

Wang, the specification, including the claims, and drawings in the U.S. Appl. No. 15/854,816, filed Dec. 27, 2017.

* cited by examiner

SEMICONDUCTOR DEVICE AND METHOD OF FORMING THE SAME

CROSS REFERENCE TO RELATED APPLICATIONS

This application is a division of U.S. application Ser. No. 15/873,904 filed Jan. 18, 2018, and incorporated herein by reference in its entirety.

BACKGROUND OF THE INVENTION

1. Field of the Invention

The present invention generally relates to a semiconductor device and a method of forming the same, and more particularly, to a trench-type gate of a dynamic random access memory (DRAM) and a method of forming the same.

2. Description of the Prior Art

A dynamic random access memory (DRAM) is one kind of volatile memory. A DRAM usually includes an array region including a plurality of memory cells and a peripheral region including control circuits. Typically, a memory cell includes one transistor and one capacitor electrically coupled to the transistor, which is known as a 1T1C cell. A digital data is stored in a memory cell by controlling the transistor to charge or discharge the capacitor. The control circuits in the peripheral region may address each of the memory cells in the array region by plural columns of word lines and plural rows of bit lines traversing the array region and electrically connected to each of the memory cells to perform reading, writing or erasing data.

In advanced technology node of semiconductor manufacturing, the dimension of a memory cell has been miniaturized for higher integrity by adopting three-dimensional structure. DRAMs having buried word line structures have been proposed and widely used in the field in which gate electrodes of transistors and word lines for controlling the transistors are formed integrally in a plurality of trenches formed in the substrate and traversing through the active regions. The transistors are trench-type gates formed at the overlapping region between the active regions and the trenches. The advantages of using buried word line structures may include improved speed and higher integrity. The leakage current resulting from the short channel effect as device shrinking may be avoided.

However, there are still some problems need to be overcome when adopting buried word line structure. For example, drain induced gate leakage (GIDL) is a serious problem for DRAMs having buried word line structures. GIDL is caused by overlapping between the source/drain region and the gate electrode of the transistor. Some attempts have been made in the field to eliminate GIDL including recessing the top surface of the gate electrode to a lower level in the trench thereby increasing the distance between the source/drain region and the gate electrode. However, the resistances of the gate electrode and the channel region may adversely increase, causing degradation of performance. Another method for avoiding GIDL is increasing the thickness of the gate dielectric layer which lines the trench and between the gate electrode and the substrate. However, thicker gate dielectric layer would unfavorably decrease the on-current (Ion) and consequently degrade the switching speed of turned-on and turned-off. Therefore, there is still a need in the field to provide a trench-type gate with reduced GIDL and better performance.

SUMMARY OF THE INVENTION

One aspect of the present invention is to provide a method of forming a semiconductor device. First, a substrate having an upper surface is provided. At least a trench is formed in the substrate. A barrier layer is formed in the trench and a conductive material is formed on the barrier layer and filling up the trench. The conductive material and the barrier layer are then recessed to a level lower than the upper surface of the substrate. Subsequently, an oxidation process is performed to oxidize the exposed portion of the conductive material and the barrier layer thereby forming an insulating layer.

Another aspect of the present invention is to provide a semiconductor device including a substrate having at least a trench formed therein. A conductive material is formed filling a lower portion of the trench. A barrier layer is formed between the conductive material and the substrate. An insulating layer is formed in the trench and completely covering the conductive material and the barrier layer, wherein a portion of the insulating layer covering the barrier layer has a bird's peak profile.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
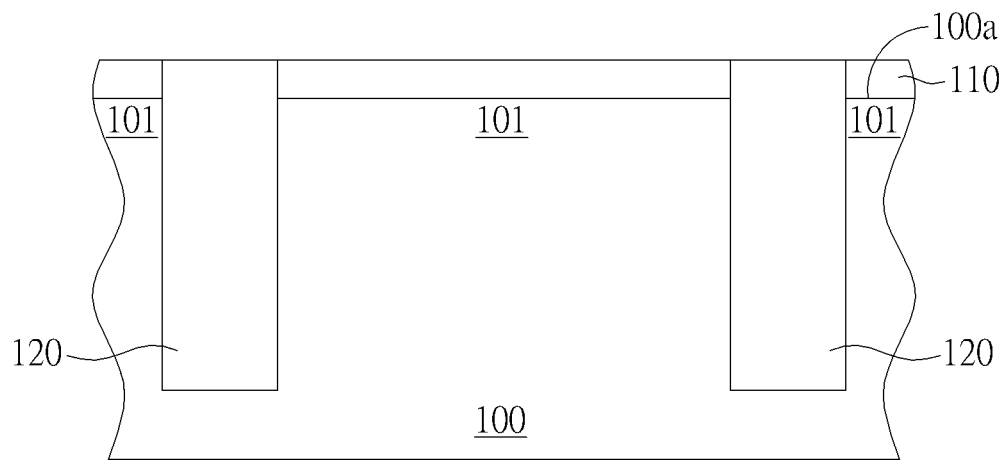
FIG. 1 to FIG. 6 are schematic cross-sectional views taken along the line A-A' in FIG. 1A to illustrate a method of forming a semiconductor device according to a preferred embodiment of the present invention.
Figure 1A:
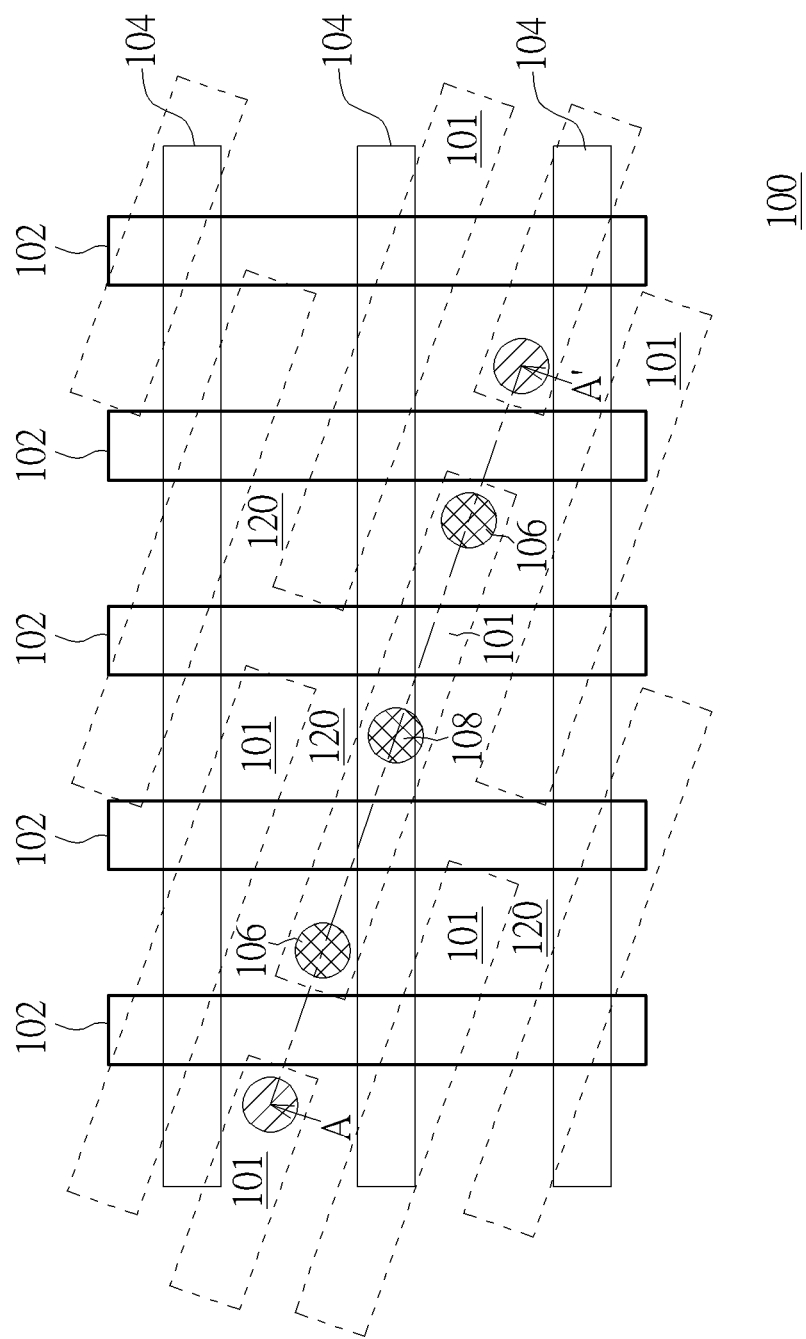
FIG. 1A is a layout top view of a semiconductor device according to a preferred embodiment of the present invention.

FIG. 1A shows a layout top view of a semiconductor device 2 according to a preferred embodiment of the present invention. The semiconductor device 2 is a DRAM, and the semiconductor devices 1 are the control gates of the semiconductor device 2. More particularly, the semiconductor devices 1 are trench-type gates. As shown in FIG. 1, the semiconductor device 2 has a substrate 100 having a shallow trench isolation (STI) structure 120 formed therein to define a plurality of active regions 101 in the substrate 100. The substrate 100 may be a silicon substrate or a silicon-on-insulator (SOI) substrate, but not limited hereto. A plurality of word lines 102 are formed in the substrate 100 and traverse through the active regions 101. A plurality of bit lines 104 are formed on the substrate 100 and striding across the active regions 101. The semiconductor devices 1 are formed in the overlapping regions of the active regions 101 and the word lines 102 and are the control gates of the memory cells in the semiconductor device 2. The active region 101 at one side of the semiconductor device 1 is electrically connected to a capacitor (not shown) through a storage node contact (SNC) plug 106 and the active region 101 at the other side of the semiconductor device 1 is electrically connected to a bit line 104 through a bit line contact (BC) 108. The channel of each semiconductor device 1 is controlled by the word line formed structurally integrated in the same trench. The capacitor (not shown) and the bit line 104 are electrically connected when the channel of the semiconductor device 1 is turned on and are electrically disconnected when the channel of the semiconductor device 1 is turned off.

FIG. 1 to FIG. 6 are schematic cross-sectional views taken along a line A-A' in FIG. 1A to illustrate a method of forming the semiconductor device 1 according to a preferred embodiment of the present invention.

Please refer to FIG. 1. First, a substrate 100 is provided. The substrate 100 has an upper surface 100a. A shallow trench isolation structure 120 is formed in the substrate 100 to define a plurality of active regions 101 in the substrate 100. A pad layer 110 may be formed on the upper surface 100a of the substrate 100 and may be used as a protecting layer for the substrate 100 in the following process. The pad layer 110 may comprise silicon oxide or silicon nitride, but not limited hereto.

Figure 2:
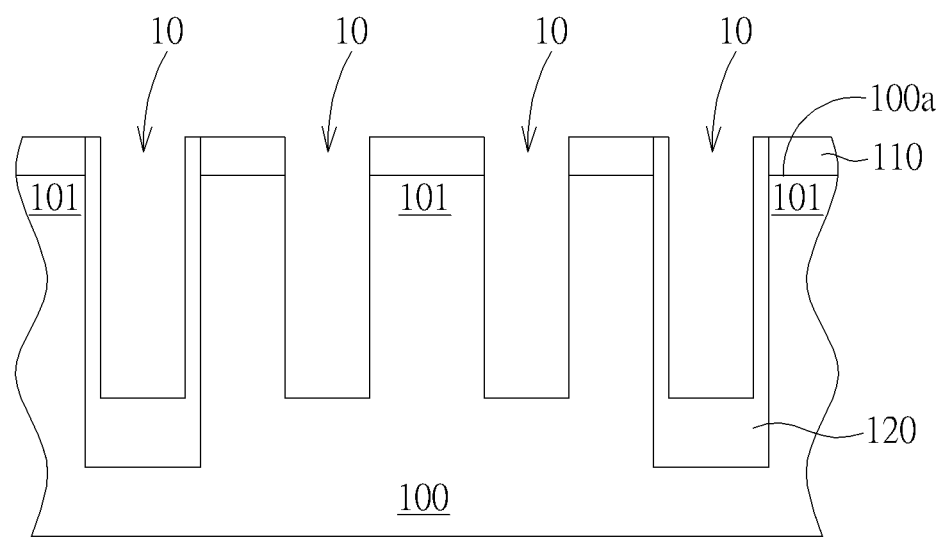

Please refer to FIG. 2. A plurality of trenches 10 are then formed in the substrate 100. When viewing from the top, the position of the trenches 10 are substantially the same as the word lines 102 as shown in FIG. 1A. FIG. 2 shows four consecutively neighboring trenches 10 wherein the inner two trenches 10 cut through a same active region 101 and the outer two trenches 10 cut through the shallow trench isolation structure 120 encompassing the two terminals of the active region 101. As shown in FIG. 2, each of the trenches 10 has a depth smaller than the depth of the shallow trench isolation structure 120. An ion implantation process may be performed before forming the trenches 10 to implant ions having a first conductivity type (such as boron (B) ions having p-type conductivity) into the substrate 100 thereby forming a well region (not shown) with the first conductivity type. It is noteworthy that when the substrate 100 having the well region (not shown) formed therein, the trenches 10 should be formed having a depth smaller than the depth of the well region and completely encompassed by the well region (not shown).

Figure 3:
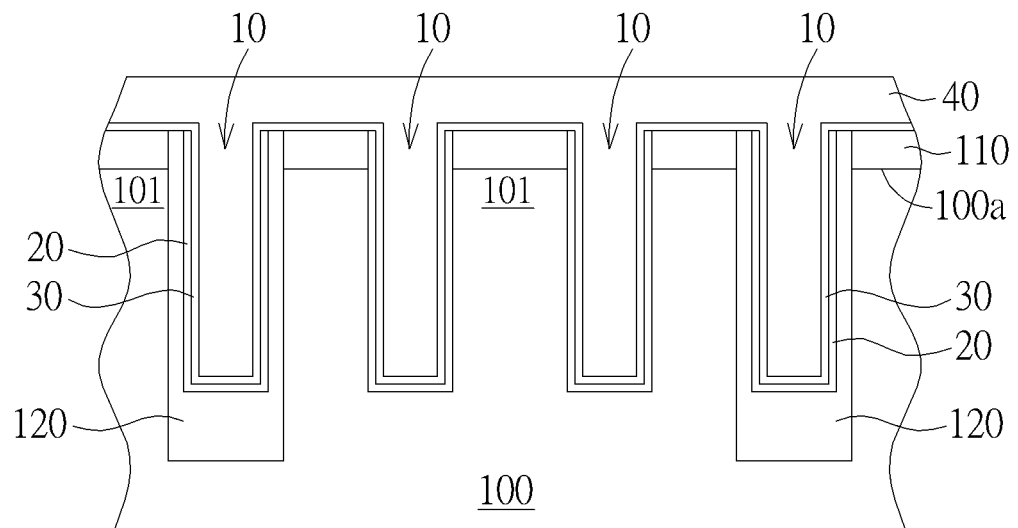

Please refer to FIG. 3. A gate dielectric layer 20 and a barrier layer 30 are then successively formed on the substrate 100, conformally covering the pad layer 110 and the bottom surface and sidewall of the trenches 10. After that, a conductive material 40 is formed to completely cover the barrier layer 30. The conductive material 40 fills up the trenches 10. The gate dielectric layer 20 may be a silicon oxide layer or a dielectric material layer formed by performing an atomic layer deposition (ALD) process or an in-situ steam generation (ISSG) process. The barrier layer 30 may include at least one of titanium (Ti), tantalum (Ta), titanium nitride (TiN) and tantalum nitride (TaN) and may have a single-layered structure or a multi-layered structure formed by performing an atomic layer deposition (ALD), a chemical vapor deposition process or a physical vapor deposition (PVD) process, but not limited hereto. The conductive material 40 may include tungsten (W), copper (Cu), aluminum (Al) or titanium (Ti), but not limited hereto.

Figure 4:
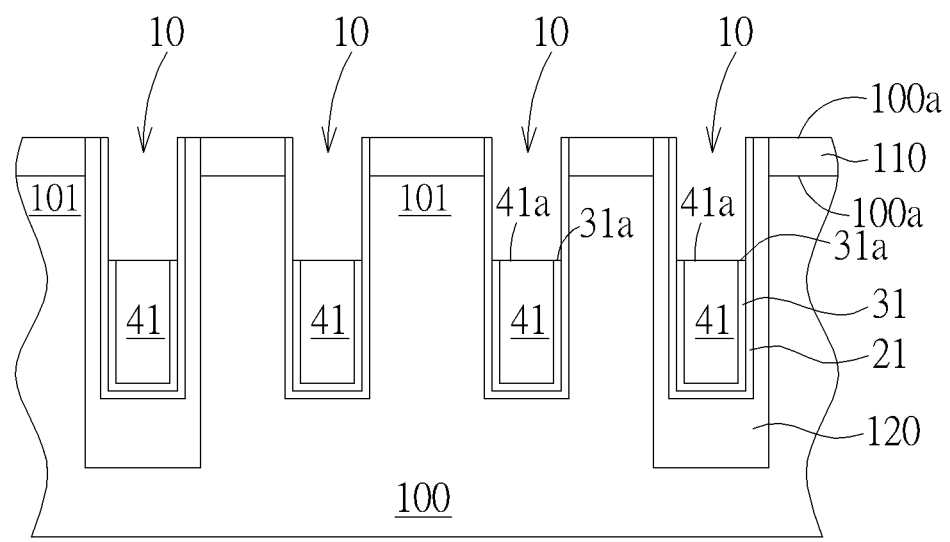

Please refer to FIG. 4. Subsequently, a chemical mechanical polishing (CMP) process or an etching back process may be performed to remove the excess conductive material 40, barrier layer 30 and gate dielectric layer 20 outside the trenches 10 until the pad layer 110 is exposed. Subsequently, the conductive material 40 and the barrier layer 30 filling in the trenches 10 are further recessed until the remaining conductive material 41 and the barrier layer 31 only fill a lower portion of each of the trenches 10. A top surface 41a of the conductive material 41 and a top surface 31a of the barrier layer 31 are both lower than the upper surface 100a of the substrate 100 and the gate dielectric layer 20 on an upper sidewall of each of the trenches 10 is exposed. As shown in FIG. 4, the top surface 41a of the conductive material 41 and the top surface 31a of the barrier layer 31 may be flush with each other. Alternatively, in other embodiment, the top surface 31a of the barrier layer 31 may be higher or lower than the top surface 41a of the conductive material 41. In the illustrated embodiment, the gate dielectric layer 20 covering on the upper sidewall of each of the trenches 10 is not removed when recessing the conductive material 40 and the barrier layer 30 and may be used as a protecting layer for the upper sidewall of each of the trenches 10 in the following process. In another embodiment, the gate dielectric layer 20 covering the upper sidewall of each of the trenches 10 may be removed concurrently when recessing the conductive material 40 and the barrier layer 30 and therefore the upper sidewall of each of the trenches 10 is exposed.

Figure 5:
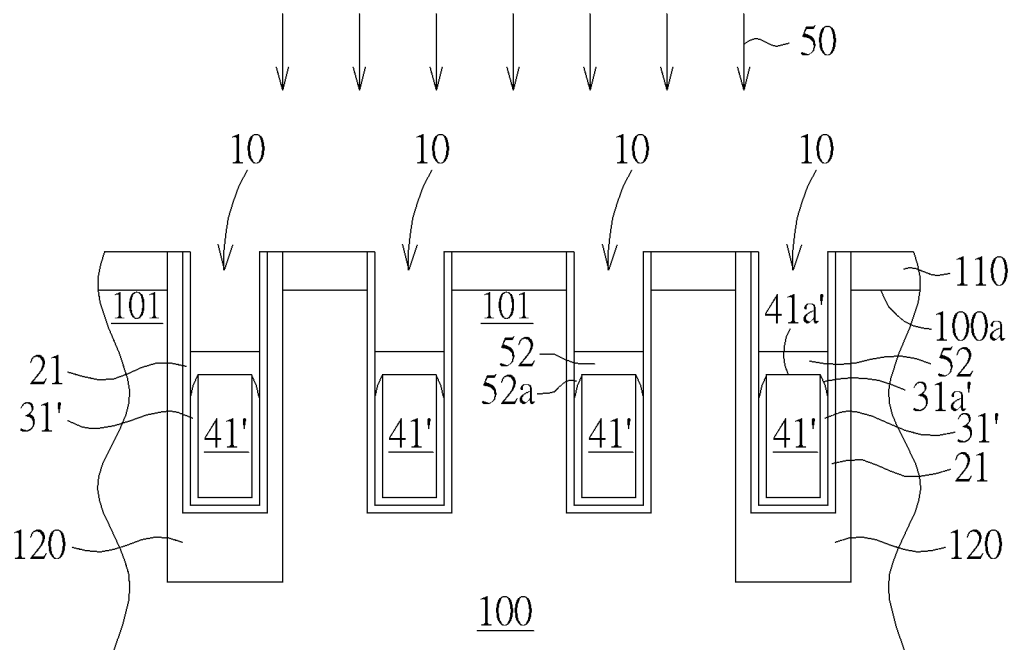

Please refer to FIG. 5. Next, an oxidation process 50 such as an in-situ steam generation (ISSG) process or a downstream plasma oxidation process may be performed to oxidize exposed portions of the conductive material 41 and the barrier layer 31 thereby forming an insulating layer 52 in each of the trenches 10. The insulating layer 52 completely covers the remaining conductive material 41' and barrier layer 31'. According to the embodiment, hydrogen gas and oxygen gas are used in the oxidation process 50 and a pre-determined percentage of the hydrogen gas in the total gas feed is provided for different oxidation rates for the conductive material 41 and the barrier layer 31. For example, the percentage of hydrogen gas in the total gas feed is between 3% and 50%. Preferably, the oxidation rate of the barrier layer 31 is higher than the oxidation rate of the conductive material 41 in the oxidation process 50. In other words, more barrier layer 31 is consumed in the oxidization process 50. The oxidized thickness of the barrier layer 31 is larger than the oxidized thickness of the conductive material 41 during the oxidation process 50. Consequently, after the oxidation process 50, a top surface 31a' of the remaining barrier layer 31' would become lower than a top surface 41a' of the remaining conductive material 41'. In one embodiment when the oxidation process 50 is an in-situ steam generation (ISSG) process, the process temperature is preferably between 950 and 1050 degrees Celsius. In another embodiment, when the oxidation process 50 is a downstream plasma oxidation process, the process temperature is preferably between 250 and 350 degrees Celsius. It is one feature of the present invention that the insulating layer 52 is formed by directly oxidizing the barrier layer 31 and the conductive material 41. Therefore, the insulating layer 52 is made of oxidation products of the barrier layer 31 and the conductive material 41. The insulating layer 52 completely covers the remaining barrier layer 31' and the conductive material 41' and has a bird's peak portion 52a covering on the top surface 31a' of the barrier layer 31' and having a bird's peak profile extending toward the depth direction of the trench 10 to be sandwiched between the barrier layer 31' and the substrate 100. According to one embodiment, the gate dielectric layer 21 on the upper sidewall of each of the trenches 10 and even a portion of the substrate 100 covered by the gate dielectric layer 21 may also be oxidized during the oxidation process 50, thereby forming an insulating layer 50 including oxidation products of the conductive material 41, the barrier layer 31, the gate dielectric layer 21 and the substrate 100.

Figure 6:
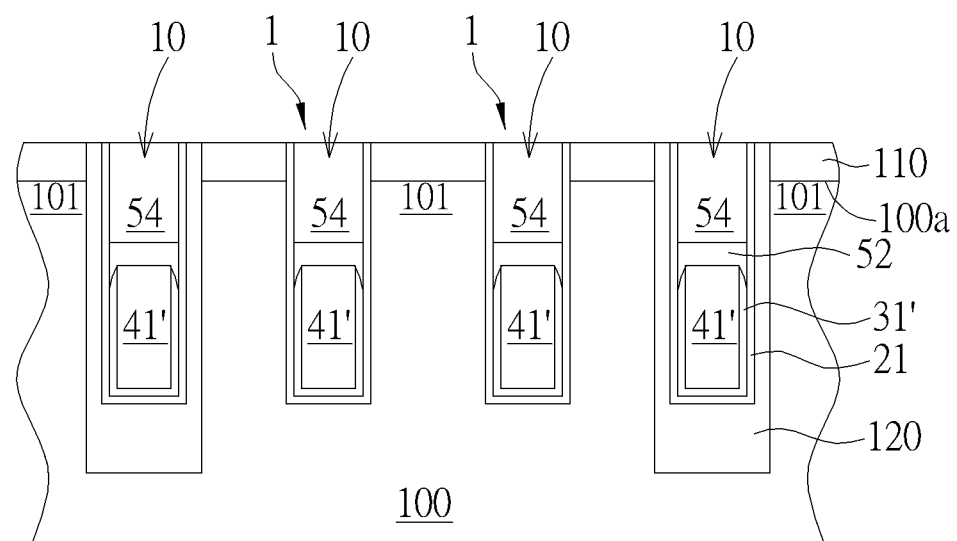

Please refer to FIG. 6. Subsequently, a cap layer 54 is formed on the insulating layer 52. The cap layer 54 fills up each of the trenches 10. A top surface of the cap layer 54 is flush with the pad layer 100 or at least flush with the upper surface 100a of the substrate 100. The cap layer 54 may be composed of a dielectric material such as silicon oxide or silicon nitride, but not limited hereto. After that, an ion implantation process may be performed to implant ions having a second conductivity type complementary to the first conductivity type, such as phosphorus (P) ions or arsenic (As) ions having n-type conductivity, into the substrate 100 adjacent to the openings of the trenches 10 to form the source/drain regions (not shown), thereby obtaining the semiconductor device 1. In another embodiment, the source/drain regions of the semiconductor device 1 may be formed before the step of forming the trenches 10. For example, after forming the well region (not shown) having the first conductivity type and before forming the trench 10, an ion implantation process is performed to implant ions having the second conductivity type into the substrate 100 to form the source/drain regions (not shown). Following process may be carried out to form a storage node contact (not shown) and a bit line contact (not shown) respectively on the source/drain regions (not shown) at two sides of the trench 10 to respectively electrically connect to a capacitor and a bit line formed later.

The semiconductor device 1 provided by the present invention as shown in FIG. 6 is a trench-type gate, wherein the conductive material 41' filling in the trench 10 of the semiconductor device 1 is the gate electrode, and the region of the substrate 100 overlapped with the conductive material 41' along the bottom and side wall of the trench 10 is the channel region. The source/drain regions (not shown) of the semiconductor device 1 are formed in the substrate 100 adjacent to the opening of the trench 10. One feature of the present invention is that an insulating layer 52 is formed conveniently by directly oxidizing the exposed portions of the conductive material 41 and the barrier layer 31. The process of the present invention is simplified and cost-effective. Furthermore, by adjusting the oxidation rate of the barrier layer 31 being higher than the oxidation rate of the conductive material 41, the barrier layer 31 is consumed faster than the conductive material 41 during the oxidation process 50. After the oxidation process 50, a barrier layer 31' having a top surface 31a' further distanced from the source/drain regions (not shown) and being lower than a top surface 41a' of the conductive material 41' is obtained without over-consuming the conductive material 41. As a result, the overlapping between the source/drain regions (not shown) and the barrier layer 31' may be prevent and leakage current (GIDL) resulting therefrom may be eliminated without the drawback of increasing the resistance of the conductive material 41'. Additionally, by forming the insulating layer 52 having a bird's peak portion 52a extending between the barrier layer 31' and the substrate 100, the effective gate oxide thickness (EOT) at the edge portion of the channel region may be increased. The leakage current occurring at the edge portion of the channel region may be reduced without decreasing on-current (Ion).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate having a pad layer disposed thereon;
    a trench through the pad layer and a portion of the substrate;
    a gate dielectric layer along a sidewall and a bottom surface of the trench;
    a conductive material formed in the trench and filling a lower portion of the trench;
    a barrier layer formed in the trench and disposed between and in direct contact with the conductive material and the gate dielectric layer;
    an insulating layer formed in the trench and completely covering the conductive material and the barrier layer, wherein a portion of the insulating layer covering on the barrier layer has a bird's peak profile, wherein a tip of the bird's peak profile points downward to directly intervene between the barrier layer and the gate dielectric layer; and
    a cap layer formed on the insulating layer and filling the trench, wherein a top surface of the cap layer is flush with an upper surface of the pad layer, the insulating layer is completely covered by the cap layer and not exposed from the upper surface of the pad layer.

2. The semiconductor device according to claim 1, wherein the portion of the insulating layer having the bird's peak profile extends between the barrier layer and the substrate.

3. The semiconductor device according to claim 1, wherein a top surface of the barrier layer is lower than a top surface of the conductive material.

4. The semiconductor device according to claim 1, wherein the insulating layer comprises oxidation products of the barrier layer and the conductive material.

5. The semiconductor device according to claim 1, wherein the barrier comprises titanium or titanium nitride, and the conductive material comprises tungsten.

6. The semiconductor device according to claim 1, further comprising a gate dielectric layer disposed between the barrier layer and the substrate.

* * * * *